United States Patent
Garg et al.

(10) Patent No.: US 12,149,241 B2
(45) Date of Patent: Nov. 19, 2024

(54) MULTIPLEXER WITH HIGHLY LINEAR ANALOG SWITCH

(71) Applicant: STMicroelectronics International N.V., Geneva (CH)

(72) Inventors: Vaibhav Garg, Jagadhri (IN); Abhishek Jain, Delhi (IN); Anand Kumar, Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/334,989

(22) Filed: Jun. 14, 2023

(65) Prior Publication Data

US 2023/0327667 A1   Oct. 12, 2023

Related U.S. Application Data

(62) Division of application No. 17/531,654, filed on Nov. 19, 2021, now Pat. No. 11,699,995.

(60) Provisional application No. 63/120,552, filed on Dec. 2, 2020.

(51) Int. Cl.
  *H03K 17/693* (2006.01)
  *H03K 17/687* (2006.01)
  *H03K 19/017* (2006.01)

(52) U.S. Cl.
  CPC ..... *H03K 17/6872* (2013.01); *H03K 17/6874* (2013.01); *H03K 17/693* (2013.01); *H03K 19/01735* (2013.01)

(58) Field of Classification Search
  CPC .......... H03K 17/6872; H03K 17/6874; H03K 17/693; H03K 2217/0054; H03K 17/6871; H03K 17/687; H03K 19/01714; H03K 19/017; H03K 19/01728; H03K 19/01707; H03K 19/01735
  See application file for complete search history.

(56) References Cited

U.S. PATENT DOCUMENTS

| | | |
|---|---|---|
| 6,404,237 B1 | 6/2002 | Mathew et al. |
| 7,471,135 B2 | 12/2008 | Raghavan et al. |
| 8,115,518 B1 | 2/2012 | Ali |
| 8,493,255 B2 | 7/2013 | Thirunakkarasu et al. |
| 9,287,862 B2 | 3/2016 | Viswanath et al. |
| 10,200,041 B2 | 2/2019 | Gorbold et al. |
| 2002/0041198 A1 | 4/2002 | Parris et al. |
| 2004/0056707 A1 | 3/2004 | Pauletti et al. |
| 2008/0130375 A1 | 6/2008 | Raghavan et al. |
| 2020/0169168 A1 | 5/2020 | Balaz et al. |
| 2021/0105014 A1* | 4/2021 | Huang ............... H03K 19/0963 |

* cited by examiner

*Primary Examiner* — Jung Kim
(74) *Attorney, Agent, or Firm* — Seed IP Law Group LLP

(57) ABSTRACT

A multiplexer includes an input, an output, and a main switch configured to pass a signal from the input to the output. The multiplexer includes two bootstrap circuits that collectively maintain a constant voltage between terminals of the main switch during alternating phases.

20 Claims, 7 Drawing Sheets

MULTIPLEXER WITH HIGHLY LINEAR ANALOG SWITCH

BACKGROUND

Technical Field

The present disclosure is related to multiplexers, and more particularly to main pass switches of multiplexers.

Description of the Related Art

Analog multiplexers include a switch that passes high frequency analog input signals from an input of the multiplexer to an output of the multiplexer. The switch may include a metal-oxide-silicon (MOS) transistor. When the transistor is enabled, the transistor acts as a resistor through which the input signal passes. If the resistance associated with the transistor is not constant, then the transistor will introduce harmonics of the input signal into the output of the multiplexer. This is undesirable.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

Embodiments of the present disclosure provide a multiplexer with a main pass transistor that maintains a relatively constant resistance while passing signals from an input of the multiplexer to an output of the multiplexer. The multiplexer achieves the constant resistance of the transistor by maintaining a constant gate to source voltage (VGS) of the transistor. The multiplexer includes two bootstrap circuits coupled to the source and gate terminals of the transistor. The two bootstrap circuits operate in alternate phases to maintain the constant VGS through operation.

BRIEF DESCRIPTION OF THE SEVERAL VIEWS OF THE DRAWINGS

Reference will now be made by way of example only to the accompanying drawings. In the drawings, identical reference numbers identify similar elements or acts. In some drawings, however, different reference numbers may be used to indicate the same or similar elements. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known aspects of integrated circuits have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
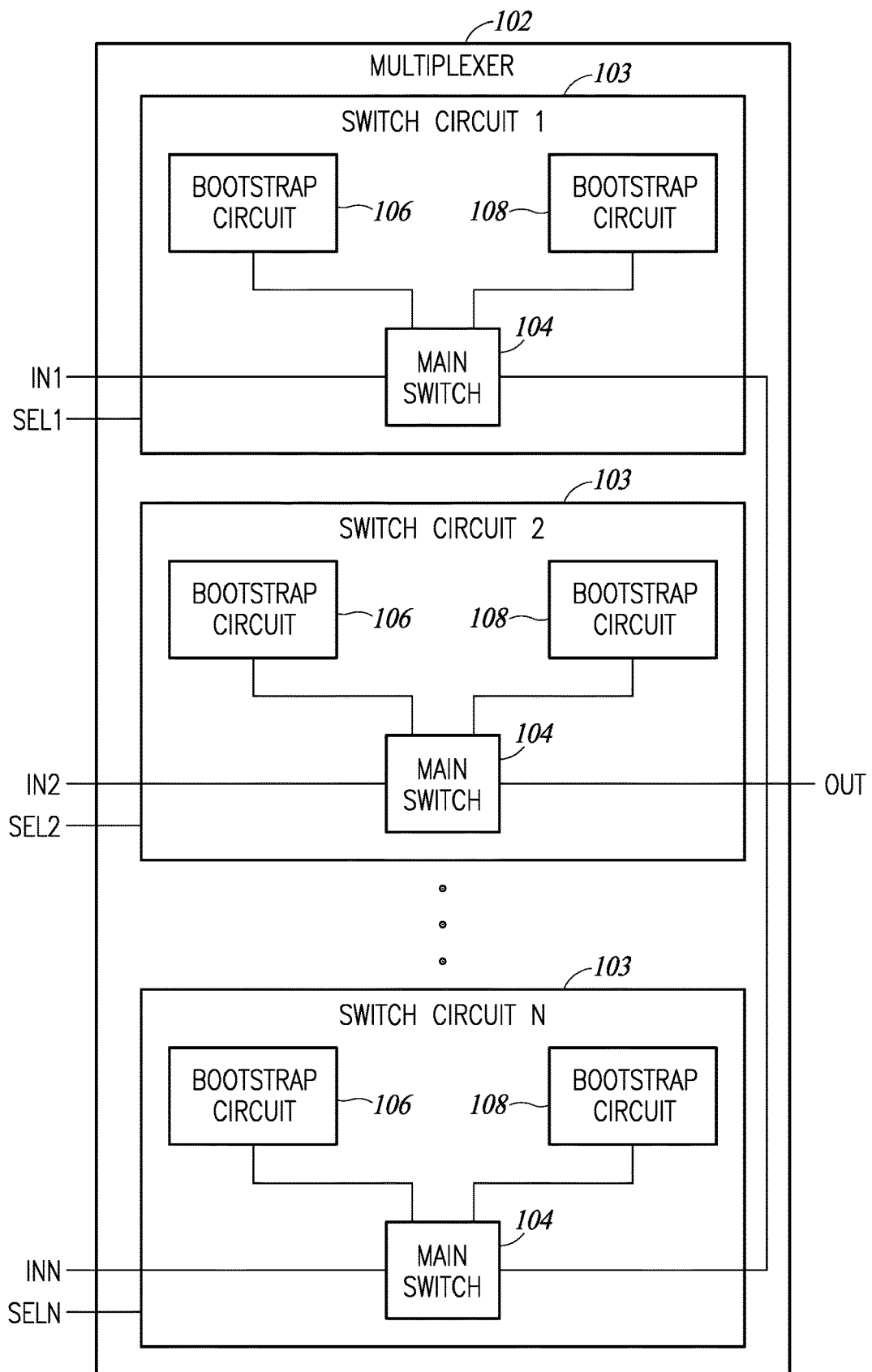
FIG. 1 is a block diagram of a multiplexer, according to one embodiment.

FIG. 1 is a block diagram of a multiplexer 102, according to one embodiment. The multiplexer 102 includes N input terminals In 1-In N and an output. For each input terminal, the multiplexer includes a respective switch circuit 103 that passes signals from that input to the output when that input is selected. Each switch circuit 103 includes a main switch 104, a first bootstrap circuit 106, and a second bootstrap circuit 108. The main switch 104 and the bootstrap circuits 106 and 108 cooperate to pass signals from the input terminal In to the output terminal Out of the multiplexer 102 without adding harmonic distortions. Each switch circuit 103 receives a respective selection signal Sel 1-Sel N. The selection signals select one of the switches 103 to pass signals to the output Out. Only one switch circuit 103 is selected at a time.

The following description describes the function of one of the switch circuits 103. Each of the switch circuits 103 functions in the same manner. When the main switch 104 is activated or turned on, the main switch 104 passes signals from the input terminal In to the output terminal Out. The main switch 104 has a resistance when activated. If the resistance is not kept constant, then the signal provided to the output terminal will include not only the input signal, but also harmonics of the input signal. The harmonics correspond to signals having a frequency that is a multiple of the frequency of the input signal. Accordingly, if the input signal has a frequency f, the output signal may include components with frequencies of 2*f, 3*f, etc., if the resistance of the main switch is not kept constant.

The main switch 104 may have a plurality of terminals including a gate terminal, an input terminal, and then output terminal. The input terminal of the main switch 104 is coupled to the input terminal In of the multiplexer 102. The output terminal of the main switch 104 is coupled to the output terminal Out of the multiplexer 102. The gate terminal receives control signals that selectively activate and deactivate the main switch 104.

The resistance of the main switch 104 is based, in part, on the voltages between its terminals. For example, the resistance of the main switch 104 may be based on the voltage between the input terminal of the main switch 104 and the gate terminal of the main switch 104. The switch circuit 103 operates to maintain a constant voltage between the input terminal of the main switch 104 and the gate terminal of the main switch 104.

The first bootstrap circuit 106 and the second bootstrap circuit 108 are both coupled to the main switch 104. The first and second bootstrap circuits 106 and 108 cooperate to maintain a constant voltage between the gate terminal and the input terminal of the main switch 104. The first and second bootstrap circuits 106 and 108 are operated in two alternating phases based on one or more clock signals. During the first phase, the first bootstrap circuit 106 maintains the constant voltage between the input terminal and the gate terminal of the main switch 104.

In one embodiment, the first and second bootstrap circuits 106 and 108 each include a respective bootstrap capacitor. During the first phase the first bootstrap capacitor is coupled between the gate terminal and the input terminal of the main switch 104. During the first phase the second bootstrap capacitor is decoupled from the gate terminal and the input terminal of the main switch 104. During the first phase the second bootstrap capacitor charges to a supply voltage value, i.e., the voltage between plates of the capacitor is charged to the supply voltage value. During the second phase, the first bootstrap capacitor is decoupled from the gate terminal and the input terminal of the main switch 104, the second bootstrap capacitor is coupled between the gate terminal and the input terminal of the main switch 104, and the first bootstrap capacitor charges to the supply voltage value.

The first and second bootstrap circuits 106 and 108 may each include a plurality of switches. The switches turn on and off in accordance with the one or more clock signals. The turning on or turning off of the switches couples and decouples the first and second bootstrap capacitors between the gate terminal and the input terminal of the main switch 104 and between high voltage supply and low voltage supply terminals.

The main switch 104 can include a field effect transistor. In this case, the input terminal of the main switch 104 is the source terminal of the transistor, the gate terminal of the main switch 104 is the gate terminal of the transistor, and the output terminal of the main switch 104 is the drain terminal of the transistor. The resistance of the field effect transistor is inversely proportional to the voltage (VGS) between the gate terminal and the source terminal. During the first phase, the first bootstrap capacitor is coupled between the source terminal and the gate terminal of the transistor. During the second phase, the second bootstrap capacitor is coupled between the source terminal and the gate terminal of the transistor. This ensures that the gate to source voltage is maintained constantly at supply voltage value. The result is that the resistance of the transistor, when active, is constant.

Figure 2:
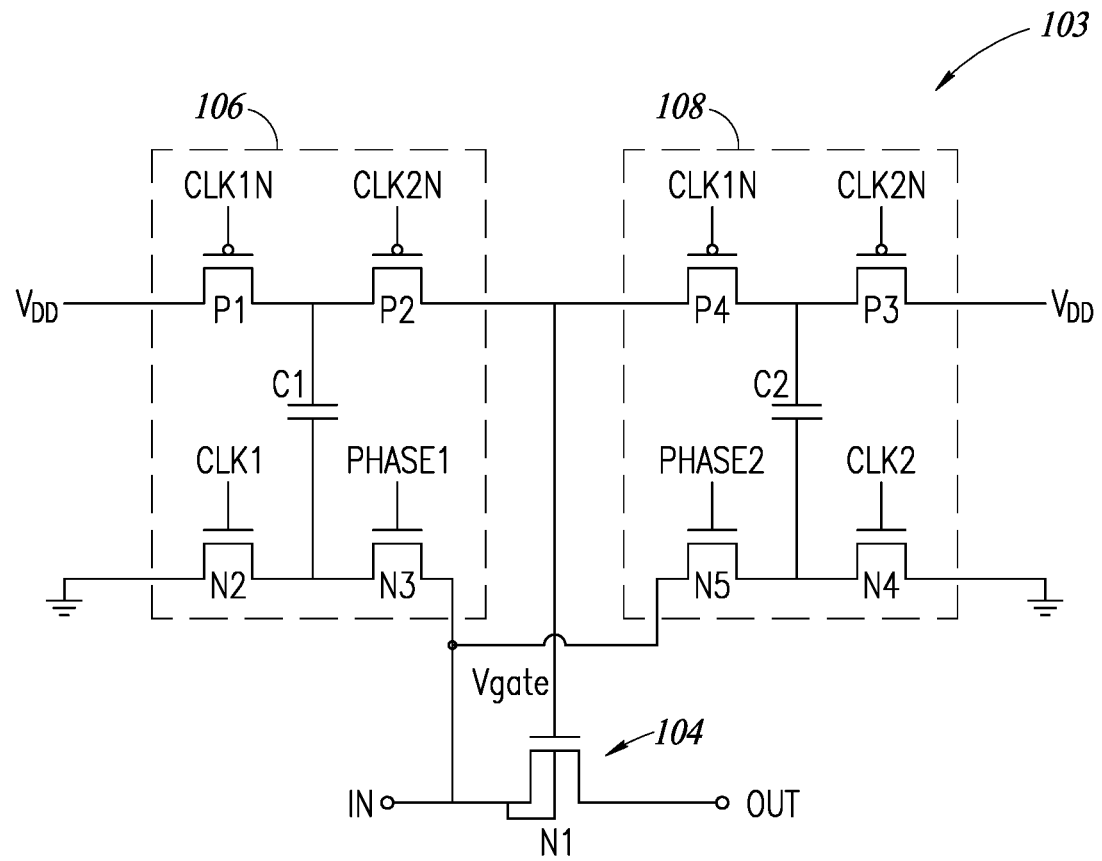
FIG. 2 is a schematic diagram of a switch circuit used in a multiplexer, according to one embodiment.
Figure 2:
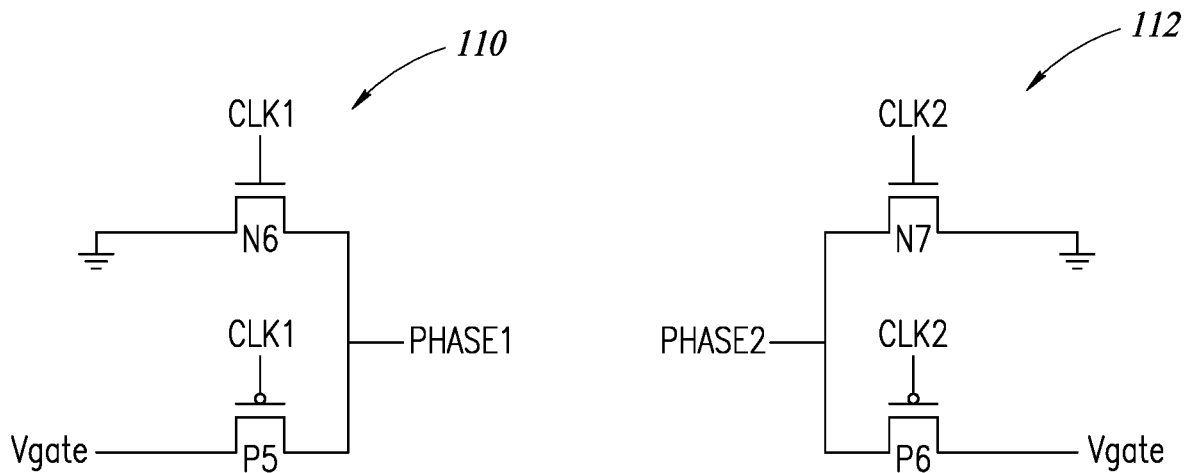

FIG. 2 is a schematic diagram of a switch circuit 103 of a multiplexer 102, according to one embodiment. FIG. 2 illustrates only a single switch circuit 103, in practice the multiplexer includes multiple switch circuits each coupled to a respective input of the multiplexer 102.

The switch circuit 103 includes an input terminal In and an output terminal Out. The switch circuit includes an NMOS transistor N1 coupled between the input terminal In and the output terminal Out. In particular, the source terminal of the transistor N1 is coupled to the input terminal In. The drain terminal of the transistor N1 is coupled to the output terminal Out. The transistor N1 is a main switch 104 of the switch circuit 103.

When the transistor N1 is activated or turned on, the transistor N1 passes signals from the input terminal In to the output terminal Out. The transistor N1 has a resistance when turned on. If the resistance is not kept constant, then the signal provided to the output terminal will include not only the input signal, but also harmonics of the input signal. The resistance of the transistor N1 is inversely proportional to the gate to source voltage of the transistor N1. Accordingly, the switch circuit 103 keeps the resistance of the transistor N1 constant by maintaining a constant gate to source voltage of the transistor N1 when the transistor N1 is activated or conducting. In particular, the switch circuit 103 utilizes the first bootstrap circuit 106 and the second bootstrap circuit 108 to maintain a constant gate to source voltage of the transistor N1.

The first bootstrap circuit 106 includes two NMOS transistors N2 and N3 and two PMOS transistors P1 and P2. The first bootstrap circuit 106 also includes a first bootstrap capacitor C1. The source terminal of the transistor N2 is coupled to the low supply voltage, ground. The drain terminal of the transistor N2 terminal is coupled to the lower terminal of the first bootstrap capacitor C1. The gate terminal of the transistor N2 receives a clock signal CLK1. The source terminal of the transistor N3 is coupled to the lower terminal of the first bootstrap capacitor C1 and to the drain terminal of the transistor N2. The drain terminal of the transistor N3 is coupled to the source terminal of the transistor N1. The gate terminal of the transistor N3 receives a first phase signal PHASE1. The source terminal of the transistor P1 is coupled to the high supply voltage $V_{DD}$. The gate terminal of the transistor P1 receives a clock signal CLK1N. The drain terminal of the transistor P1 is coupled to the upper terminal of the first bootstrap capacitor C1. The drain terminal of the transistor P2 is coupled to the drain terminal of the transistor P1 and to the upper terminal of the first bootstrap capacitor C1. The source terminal of the transistor P2 is coupled to the gate terminal of the transistor N1. The gate terminal of the transistor P2 receives a clock signal CLK2N.

The second bootstrap circuit 108 includes two NMOS transistors N4 and N5 and two PMOS transistors P3 and P4. The second bootstrap circuit 108 also includes a second bootstrap capacitor C2. The source terminal of the transistor N4 is coupled to the low supply voltage, ground. The drain terminal of the transistor N4 terminal is coupled to the lower terminal of the second bootstrap capacitor C2. The gate terminal of the transistor N4 receives a clock signal CLK2. The source terminal of the transistor N5 is coupled to the lower terminal of the second bootstrap capacitor C2 and to the drain terminal of the transistor N4. The drain terminal of the transistor N5 is coupled to the source terminal of the transistor N1. The gate terminal of the transistor N5 receives a second phase signal PHASE2. The source terminal of the transistor P3 is coupled to the high supply voltage $V_{DD}$. The gate terminal of the transistor P3 receives a clock signal CLK2N. The drain terminal of the transistor P3 is coupled to the upper terminal of the second bootstrap capacitor C2. The drain terminal of the transistor P4 is coupled to the drain terminal of the transistor P3 and to the upper terminal of the second bootstrap capacitor C2. The source terminal of the transistor P4 is coupled to the gate terminal of the transistor N1 and to the source terminal of the transistor P2. The gate terminal of the transistor P4 receives a clock signal CLK1N.

The switch circuit 103 also includes a first phase generation circuit 110 and a second phase generation circuit 112. The first phase generation circuit 110 includes an NMOS transistor N6 and a PMOS transistor P5. The source of the transistor N6 is coupled to ground. The gate of the transistor N6 receives the clock signal CLK1. The drain terminal of the transistor P5 is coupled to the drain terminal of the transistor N6. The source terminal of the transistor P5 is coupled to the gate terminal of the transistor N1. The gate terminal of the transistor P5 receives the clock signal CLK1. The drain terminal of the transistor P5 and the drain terminal of the transistor N6 correspond to the output of the first phase generation circuit 110 and output the first phase signal PHASE1. The first phase generation circuit 110 may be part of the first boot strap circuit 106.

The second phase generation circuit 112 includes an NMOS transistor N7 and a PMOS transistor P6. The source of the transistor N7 is coupled to ground. The gate of the transistor N7 receives the clock signal CLK2. The drain terminal of the transistor P6 is coupled to the drain terminal of the transistor N7. The source terminal of the transistor P6 is coupled to the gate terminal of the transistor N1. The gate terminal of the transistor P6 receives the clock signal CLK2. The drain terminal of the transistor P6 and the drain terminal of the transistor N7 correspond to the output of the second phase generation circuit 112 and output the second phase signal PHASE2. The second phase generation circuit 112 may be part of the second boot strap circuit 108.

Figure 4:
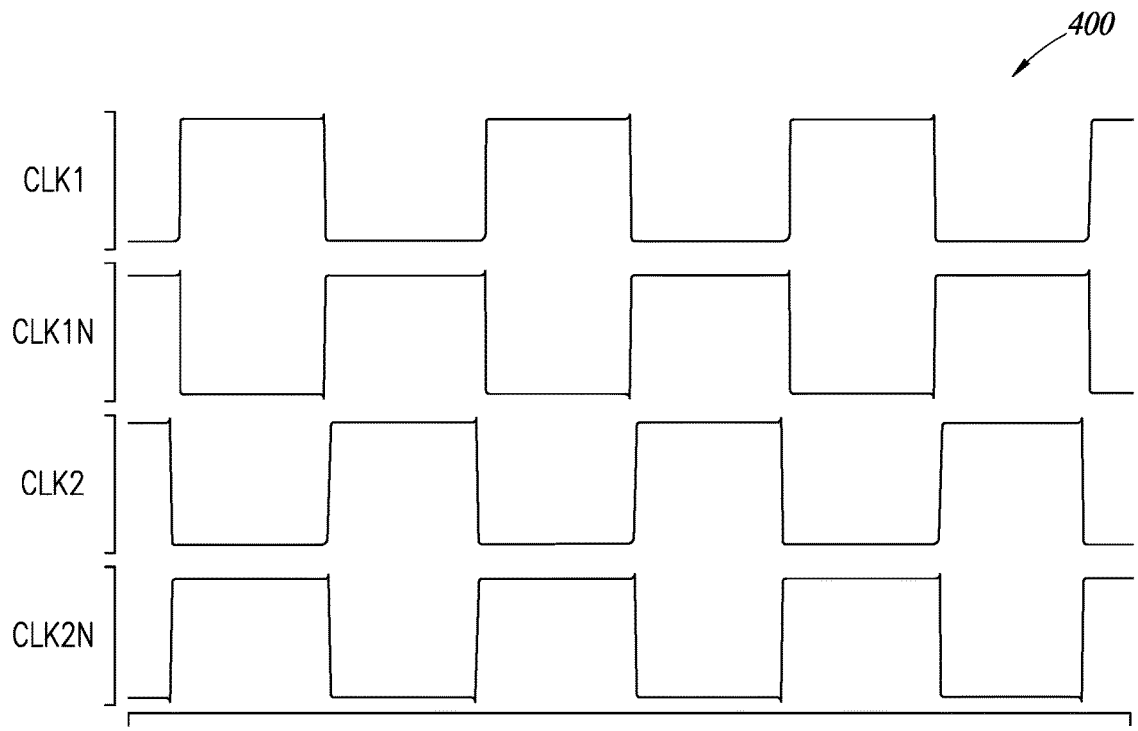
FIGS. 4-7 are timing diagrams of signals within the multiplexer, according to one embodiment.
Figure 5:
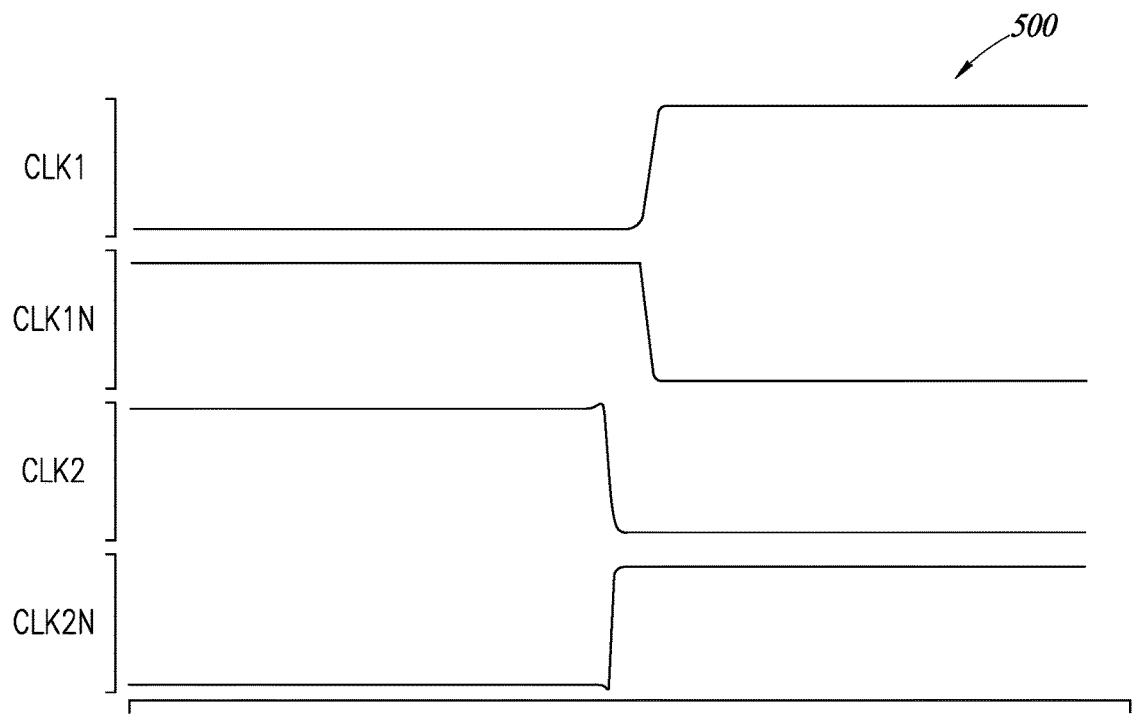

The function of the first and second bootstrap circuits 106 and 108 can be understood with reference to FIGS. 4-7. FIGS. 4-7 illustrate timing diagrams of the various clock signals and phase signals associated with the multiplexer 102 of FIG. 2. With reference to FIG. 4, the clock signal CLK1 and CLK1N are complements of each other. In other words, CLK1N is 180° out of phase with CLK1. When CLK1 is high, CLK1N is low, and vice versa Likewise, the clock signals CLK2 and CLK2N are complements of each other. When CLK2 is high, CLK2N is low, and vice versa. CLK1 and CLK2 are nearly 180° out of phase. However, as can be seen from the zoomed in timing diagram of FIG. 5, CLK2 transitions from high to low slightly before CLK1 transitions from low to high. Likewise, CLK1 transitions from high to low slightly before CLK2 transitions from low to high. As will be set forth in more detail below, this can help ensure that VGS of the transistor N1 will be maintained at a constant value.

Figure 6:
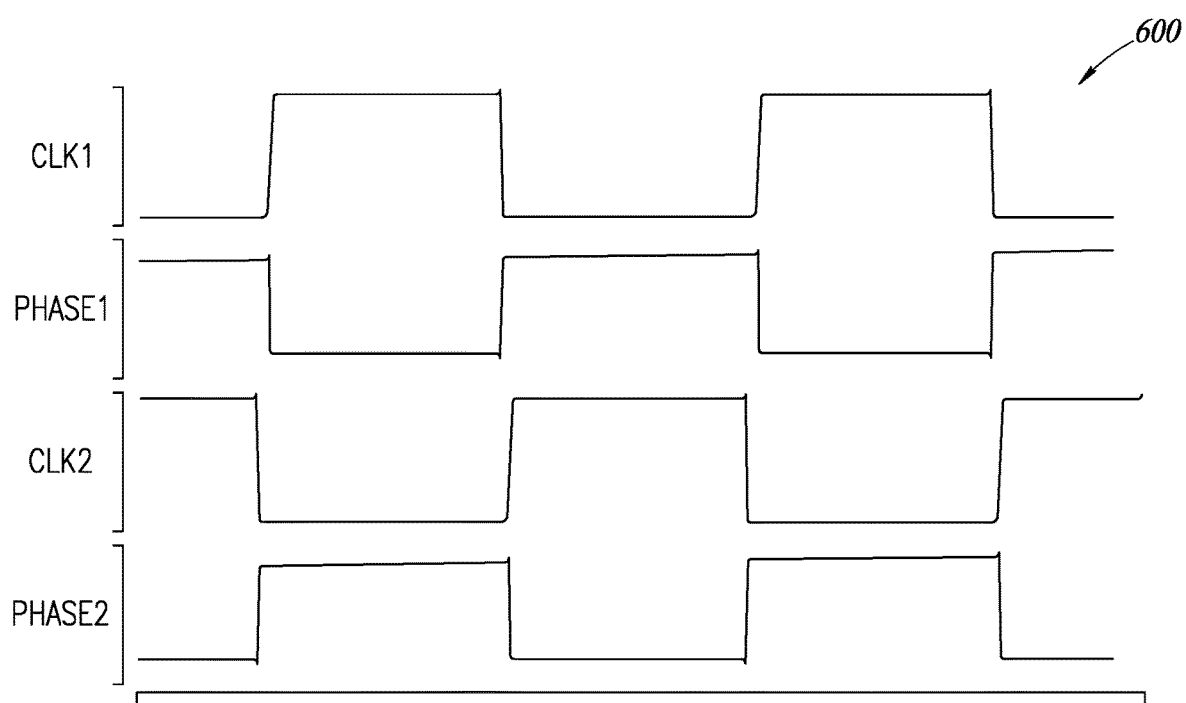
Figure 7:
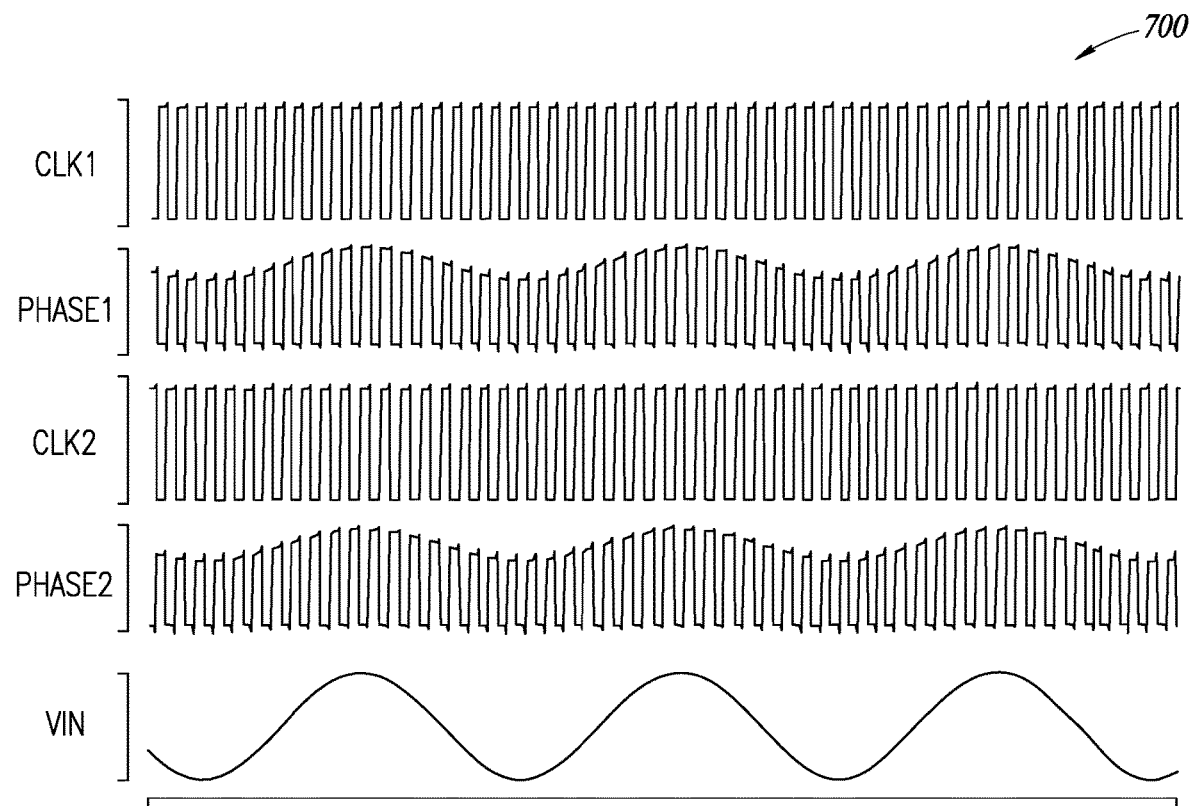

FIG. 6 illustrates the relationship between the clock signal CLK1 and the first phase signal PHASE1. FIG. 6 also illustrates the relationship between the clock signal CLK2 and the second phase signal PHASE2. FIG. 7 illustrates that the amplitude of PHASE1 and PHASE2 vary with the input signal Vin.

Returning again to FIG. 2, the switch circuit 103 of multiplexer 102 operates in two phases. During phase 1, the first phase signal PHASE1 is high, rendering the transistor N3 conducting. With the transistor N3 conducting, the source terminal of the transistor N1 is coupled to the bottom terminal of the first bootstrap capacitor C1. The clock signal CLK2N is low, rendering the transistor P2 conducting. With the transistor P2 conducting, the top terminal of the capacitor C1 is coupled to the gate terminal of the transistor N1. Thus, during the first phase the source and gate terminals of the transistor N1 coupled between the two terminals of the capacitor C1. Accordingly, the gate to source voltage of the transistor N1 has the value of the voltage between the terminals of bootstrap capacitor C1. At the beginning of the first phase, the first bootstrap capacitor C1 has been charged to the supply voltage value $V_{DD}$. In other words, the voltage difference between the terminals of the capacitor C1 corresponds to the voltage difference between ground and $V_{DD}$.

During the first phase the clock signal CLK1N is high, rendering the transistor P1 nonconducting. During the first phase the clock signal CLK1 is low, rendering the transistor N2 nonconducting. Accordingly, during the first phase the first bootstrap capacitor C1 is decoupled from the low supply voltage ground and the high supply voltage $V_{DD}$. The voltage on the top plate of the bootstrap capacitor C1 is floating with a fixed voltage difference between the top plate and the bottom plate. The bottom plate of the bootstrap capacitor C1 is coupled to the input terminal In of the multiplexer 102 and, correspondingly, to the source of the transistor N3.

During phase 1, when an input voltage is received at the input terminal In, the floating top plate of the first bootstrap capacitor C1 is forced to a value that is $V_{DD}$ greater than the input voltage received at the input terminal In. Because the top plate of the first bootstrap capacitor C1 is floating during phase 1, and because the voltage difference at the beginning of phase 1 was equal to $V_{DD}$, the voltage difference between the bottom plate and the top plate of the first bootstrap capacitor C1 is fixed to $V_{DD}$. Accordingly, the voltage on the top plate of the first bootstrap capacitor C1 changes in accordance with the voltage at the source terminal of the transistor N1, which is coupled to the input terminal of the multiplexer 102. If the input voltage increases, the voltage on the top plate of the first bootstrap capacitor C1 increases by the same amount. If the input voltage decreases, the voltage on the top plate of the first bootstrap capacitor C1 decreases by the same amount. Thus, the voltage difference between the gate and the source terminals of the transistor N1 is always equal to the high supply voltage $V_{DD}$. Because the gate to source voltage of the transistor N1 is constant, the resistance of the transistor N1 is constant. This ensures that signals can be passed from the input terminal In through the transistor N1 to the output terminal Out without introducing harmonics into the signals.

During phase 1, the phase signal PHASE 2 is low, rendering the transistor N5 nonconducting. The clock signal CLK1N is high, rendering the transistor P4 nonconducting. Because the transistors P4 and N5 are nonconducting during the first phase, gate and source terminals of the transistor N1 are decoupled from the terminals of the second bootstrap capacitor C2.

During phase 1, the clock signal CLK2 is high, rendering the transistor N4 conducting. Because the transistor N4 is conducting, the bottom plate of the second bootstrap capacitor C2 is coupled to the low supply voltage, ground. During phase 1, the clock signal CLK2N is low, rendering the transistor P3 conducting. Because the transistor P3 is conducting, the top plate of the second bootstrap capacitor C2 is coupled to the high supply voltage $V_{DD}$. Accordingly, during phase 1, the bootstrap capacitor C2 charges to $V_{DD}$.

In other words, during phase 1 the terminals of the second bootstrap capacitor C2 are charged to a voltage difference of $V_{DD}$.

During phase 2, the first bootstrap circuit 106 is decoupled from the source and gate terminals of the transistor N1. This is because during the second phase signal PHASE1 is low and the clock signal CLK2N is high, rendering the transistors N3 and P2 nonconducting. During phase 2, the clock signal CLK1 is high, rendering the transistor N2 conducting. This couples the bottom terminal of the first bootstrap capacitor C1 to the low supply voltage, ground. During phase 2 the clock signal CLK1N is low, rendering the transistor P1 conducting. This couples the top terminal of the first bootstrap capacitor C1 to the high supply voltage $V_{DD}$. Accordingly, during phase 2 while the first bootstrap circuit 106 is decoupled from the transistor N1, the first bootstrap capacitor C1 charges to achieve a voltage difference of $V_{DD}$ on its terminals.

During phase 2, the second bootstrap circuit 108 is coupled to the source and gate terminals of the transistor N1. During phase 2 the second phase signal PHASE 2 is high, rendering the transistor N5 conducting. Because the transistor N5 is conducting, the source terminal of the transistor N1 is coupled to the bottom plate of the second bootstrap capacitor C2. During phase 2, the clock signal CLK1N is low, rendering the transistor P4 conducting. Because the transistor P4 is conducting, the upper terminal of the second bootstrap capacitor C2 is coupled to the gate terminal of the transistor N1.

During phase 2 the clock signal CLK2N is high, rendering the transistor P3 nonconducting. During phase 2 the clock signal CLK2 is low, rendering the transistor N4 nonconducting. Accordingly, during phase 2 the second bootstrap capacitor C2 is decoupled from the low supply voltage ground and the high supply voltage $V_{DD}$. The voltage on the top plate of the bootstrap capacitor C2 is floating with a fixed voltage difference between the top plate and the bottom plate equal to $V_{DD}$ because the capacitor C2 was charged in $V_{DD}$ during phase 1. The bottom plate of the bootstrap capacitor C2 is coupled to the input terminal In of the multiplexer 102 and, correspondingly, to the source of the transistor N1.

During phase 2, when an input voltage is received at the input terminal In, the floating top plate of the second bootstrap capacitor C2 is forced to a value that is $V_{DD}$ greater than the input voltage received at the input terminal In. Because the top plate of the second bootstrap capacitor C2 is floating during phase 2, and because the voltage difference at the beginning of phase 2 was equal to $V_{DD}$, the voltage difference between the bottom plate and the top plate of the second bootstrap capacitor C2 is fixed to $V_{DD}$. Accordingly, the voltage on the top plate of the second bootstrap capacitor C2 changes in accordance with the voltage at the source terminal of the transistor N1, which is coupled to the input terminal of the multiplexer 102. If the input voltage increases, the voltage on the top plate of the second bootstrap capacitor C2 increases by the same amount. If the input voltage decreases, the voltage on the top plate of the second bootstrap capacitor C2 decreases by the same amount. Thus, the voltage difference between the gate and the source terminals of the transistor N1 is always equal to the high supply voltage $V_{DD}$ during phase 2. Because the gate to source voltage of the transistor N1 is constant during phase 2, the resistance of the transistor N1 is constant. This ensures that signals can be passed from the input terminal In through the transistor N1 to the output terminal Out without introducing harmonics into the signals.

As set forth above, during phase 1 the first bootstrap capacitor is coupled to the source and gate terminals of the transistor N1 while the second bootstrap capacitor C2 is decoupled from the source and gate terminals of the transistor N1 and charges or recharges to $V_{DD}$. During phase 2 the first bootstrap capacitor is decoupled from the source and gate terminals of the transistor N1 and charges or recharges to $V_{DD}$ while the second bootstrap capacitor C2 is coupled to the gate and source terminals of the transistor N1. Phase 1 and phase 2 alternate continuously until the multiplexer decouples the input In from the output Out. During phase 1 and phase 2, the gate to source voltage of the transistor N1 is maintained at a constant value. Accordingly, during phase 1 and phase 2 the resistance of the transistor N1 is maintained at a constant value.

In one embodiment, the transistors N1, N3, and N5 are smaller transistors than the other transistors of the switch circuit 103 of multiplexer 102. This may mean that the transistors N1, N3, and N5 have smaller channel lengths, channel widths, or dielectric thicknesses than do the other transistors of the switch circuit 103 of multiplexer 102. Accordingly, the transistors N1, N3, and N5 may be lower voltage transistors that can operate on lower supply voltages. The decreased dimensions and voltages of the transistors N1, N3, and N5 enable the transistors N1, N3, and N5 to have faster switching times. This is because the various capacitances between the terminals of the transistors N1, N3, and N5 is smaller than the various capacitances between the terminals of the other transistors of the switch circuit 103 of multiplexer 102. The first and second bootstrap circuits 106 and 108 protect the transistors N1, N3, and N5 from dangerous high voltages. Accordingly, the transistors N1, N3, and N5 can be faster switching transistors able to operate at higher frequencies.

In one embodiment, the capacitance of the bootstrap capacitors C1 and C2 is between 0.5 pF and 2.0 pF. Other capacitance values can be utilized for the bootstrap capacitors C1 and C2 without departing from the scope of the present disclosure. In one embodiment, the supply voltage $V_{DD}$ is about 1 V, though other values can be utilized without departing from the scope of the present disclosure. In one embodiment, the frequency of the clock signals CLK1 and CLK 2 is between 1 MHz and 1 GHz, though other values can be utilized without departing from the scope of the present disclosure.

Figure 3:
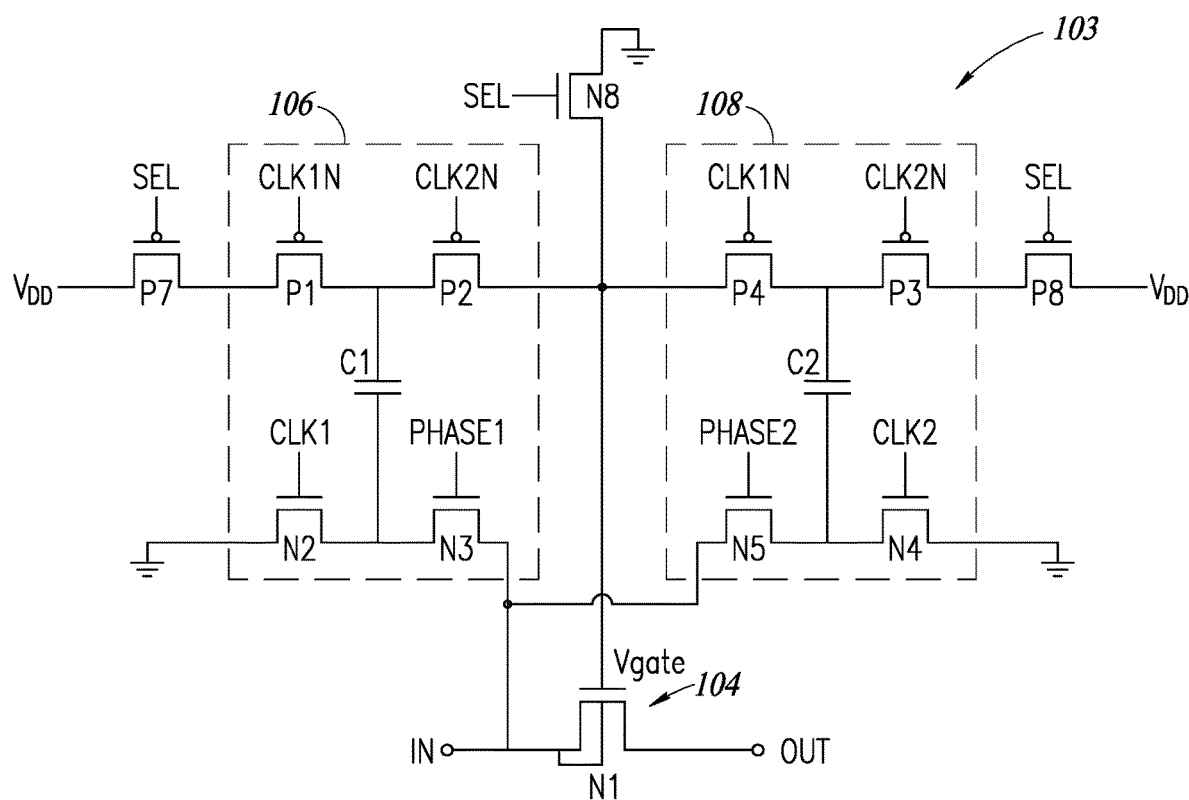
FIG. 3 is a schematic diagram of a switch circuit used in a multiplexer according to one embodiment.

FIG. 3 is a schematic diagram of a switch circuit 103 used in multiplexer 102 according to one embodiment. The switch circuit 103 of FIG. 3 is substantially similar to the switch circuit 103 of FIG. 2, except that the switch circuit 103 of FIG. 3 includes selection P7, P8, and N8. The transistor P7 is coupled between the high supply voltage $V_{DD}$ and the transistor P1. The transistor P8 is coupled between the high supply voltage $V_{DD}$ and the transistor P3. The transistor N8 is coupled between the gate terminal of the transistor N1 and ground. Each of the selection transistors P7, P8, and N8 receive a selection signal SEL. If the selection signal SEL is high, the transistors P7 and P8 are turned off, thereby decoupling the first and second bootstrap circuits 106 and 108 from the supply voltage $V_{DD}$. When the selection signal is high the transistor N8 is rendered conducting, thereby coupling the gate terminal of the transistor N1 to ground. Thus, if the selection signal SEL is high, the transistor N1 becomes nonconducting and the signal will not be passed between the input terminal In and the output terminal Out.

When the selection signal SEL is low, the transistors P7 and P8 are rendered conducting, thereby coupling the transistors P1 and P3 to the high supply voltage $V_{DD}$. When the selection signal is low, the transistor N8 is rendered non-conducting, thereby decoupling the gate terminal of the transistor N1 from ground. When the selection signal SEL is low, the bootstrap capacitors C1 and C2 can be charged to $V_{DD}$ and alternately coupled between the gate and source terminals of the transistor N1. Accordingly, when the selection signal SEL is low, the transistor N1 is rendered conducting and is able to pass signals between the input terminal In and the output terminal Out.

Figure 8:
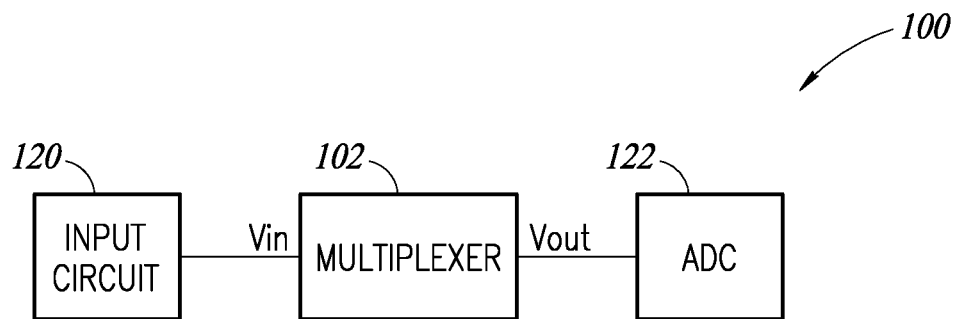
FIG. 8 is a block diagram of an integrated circuit, according to one embodiment.

FIG. 8 is a block diagram of an integrated circuit 100, according to one embodiment. The integrated circuit 100 includes a multiplexer 102. The multiplexer 102 can correspond to the multiplexer 102 described in relation to FIGS. 1-7. The integrated circuit 100 also includes an input circuit 120 and an analog-to-digital converter (ADC) 122. The input circuit 120 provides an analog input voltage signal Vin to the input terminal In of the multiplexer 102. The multiplexer 102 outputs an analog output voltage signal Vout to the ADC 122. The input voltage signal passes through the main switch 104, such as the transistor N1, to the output Out of the multiplexer 102. Because the resistance of the main switch 104 is maintained in the constant value, the output voltage signal Vout does not include harmonics of the input voltage signal. This enables the ADC 122 to make a reliable digital conversion of the analog voltage output signal Vout.

Figure 9:
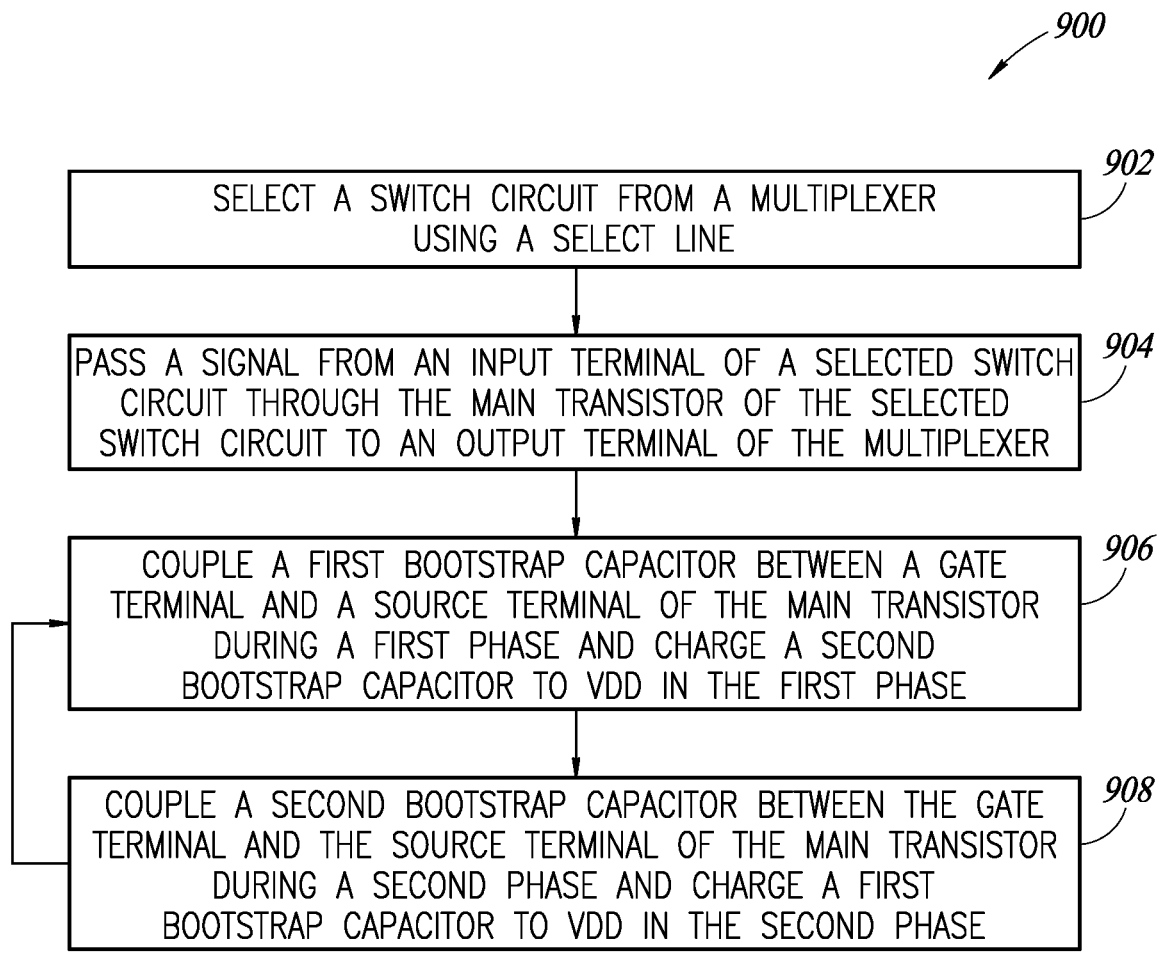
FIG. 9 is a flow diagram of a method for operating a multiplexer, according to one embodiment.

FIG. 9 is a flow diagram of a method 900 for operating a multiplexer, according to one embodiment. At 902, the method 900 includes selecting a switch circuit from a multiplexer using a select line. At 904, the method 900 includes passing a signal from an input terminal of the selected switch circuit through a main transistor of the selected switch circuit to an output terminal of the multiplexer. At 906, the method 900 includes coupling a first bootstrap capacitor between a gate terminal and a source terminal of the main transistor during a first phase and charging a second bootstrap to $V_{DD}$ in the first phase. At 908, the method 900 includes coupling the second bootstrap capacitor between the gate terminal and the source terminal of the main transistor during a second phase and charging the first bootstrap capacitor to $V_{DD}$ in the second phase. While the switch circuit is selected, method 900 alternates between steps 906 and 908.

Figure 10:
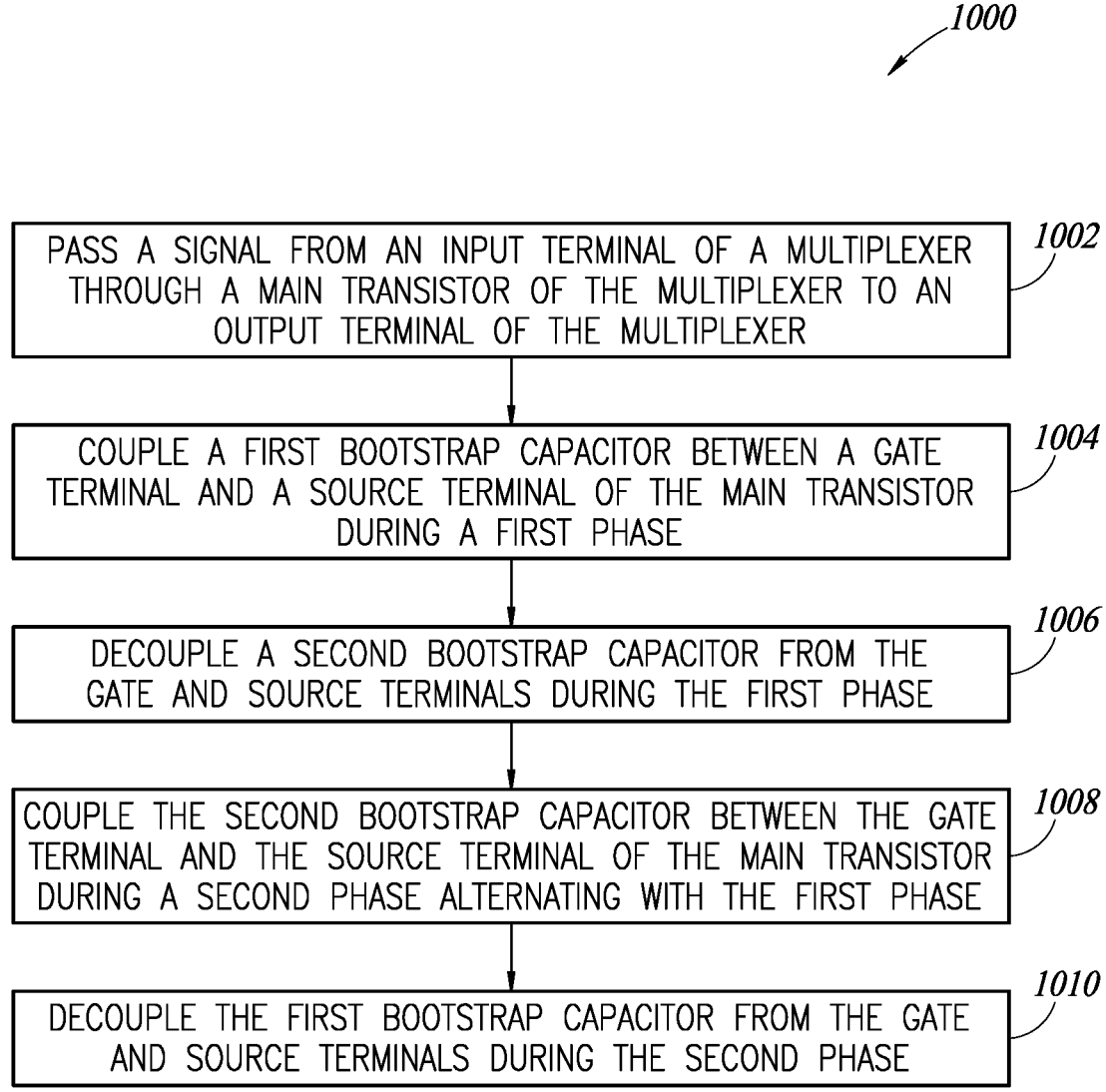
FIG. 10 is a flow diagram of a method for operating a multiplexer, according to one embodiment.

FIG. 10 is a flow diagram of a method 1000 for operating a multiplexer, according to one embodiment. At 1002, the method 1000 includes passing a signal from an input terminal of a multiplexer through a main transistor of the multiplexer to an output terminal of the multiplexer. At 1004, the method 1000 includes coupling a first bootstrap capacitor between a gate terminal and a source terminal of the main transistor during a first phase. At 1006, the method 1000 includes decoupling a second bootstrap capacitor from the gate and source terminals during the first phase. At 1008, the method 1000 includes coupling the second bootstrap capacitor between the gate terminal and the source terminal of the main transistor during a second phase alternating with the first phase. At 1010, the method 1000 includes decoupling the first bootstrap capacitor from the gate and source terminals during the second phase. In practice, steps 1004 and 1006 occur at the same time. In practice, steps 1008 and 1010 occur at the same time. After step 1010, the method 1000 returns to step 1004 and steps 1004-1010 are repeated. In practice, step 1002 occurs continuously throughout steps 1004-1010.

In one embodiment, a multiplexer includes an input terminal, an output terminal, and a main switch coupled between the input terminal and the output terminal and configured to pass a signal between the input terminal and the output terminal. The switch circuit of the multiplexer includes a first boot strap circuit including a first bootstrap capacitor and configured to couple the first bootstrap capacitor to the main switch during a first phase and to decouple the first bootstrap capacitor from the main switch during a second phase. The switch circuit of the multiplexer includes a second boot strap circuit including a second bootstrap capacitor and is configured to couple the second bootstrap capacitor to the main switch during the second phase and to decouple the second bootstrap capacitor from the main switch during the first phase.

In one embodiment, a method includes passing a signal from an input terminal of a multiplexer through a main transistor of the multiplexer to an output terminal of the multiplexer, coupling a first bootstrap capacitor between a gate terminal and a source terminal of the main transistor during a first phase, and coupling a second bootstrap capacitor between the gate terminal and the source terminal of the main transistor during a second phase alternating with the first phase.

In one embodiment, an integrated circuit includes a multiplexer. The multiplexer includes an input configured to receive an analog signal, an output configured to pass the analog signal, and a main transistor having a source terminal coupled to the input, a drain terminal coupled to the output, and a gate terminal configured to pass a signal between the input and the output. The switch circuit of the multiplexer includes a first bootstrap capacitor configured to be coupled between the source and the gate during a first phase and to be decoupled from the source and gate during a second phase. The switch circuit of the multiplexer includes a second bootstrap capacitor configured to be coupled between the source and the gate during the second phase and to be decoupled from the source and gate during the first phase.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A multiplexer, comprising:
   an output terminal;
   a plurality of input terminals; and
   a plurality of switch circuits each coupled between the output terminal and a respective input terminal, each switch circuit including:
      a main transistor coupled between the respective input terminal and the output terminal;
      a first boot strap circuit including a first bootstrap capacitor and configured to selectively couple and decouple the first bootstrap capacitor between a gate terminal and a source terminal of the main transistor; and
      a second boot strap circuit including a second bootstrap capacitor and configured to selectively couple and decouple the second bootstrap capacitor between a gate terminal and a source terminal of the main transistor.

2. The multiplexer of claim 1, wherein, for each switch circuit, the first boot strap circuit is configured to:

couple the first bootstrap capacitor between the gate terminal and the source terminal of the main transistor during a first phase and to decouple the first bootstrap capacitor from between the source terminal and the gate terminal of the main transistor during a second phase; and couple the second bootstrap capacitor between the gate terminal and the source terminal of the main transistor during the second phase and to decouple the second bootstrap capacitor from between the source terminal and the gate terminal of the main transistor during the first phase.

3. The multiplexer of claim 2, wherein for each switch circuit, the first boot strap circuit receives a first phase signal and the second boot strap circuit receives a second phase signal.

4. The multiplexer of claim 3, wherein the first phase signal and the second phase signals are square waves 180 degrees out of phase with each other.

5. The multiplexer of claim 2, wherein during the first phase the second bootstrap capacitor charges to a supply voltage value, wherein during the second phase the first bootstrap capacitor charges to the supply voltage value.

6. The multiplexer of claim 5, wherein the first bootstrap circuit includes a plurality of first switches configured to selectively couple and decouple the first bootstrap capacitor between the gate and source terminals of the transistor during the first and second phases.

7. The multiplexer of claim 6, wherein the second bootstrap circuit includes a plurality of second switches configured to selectively couple and decouple the second bootstrap capacitor between the gate and source terminals of the main transistor during the first and second phases.

8. The multiplexer of claim 7, wherein the first and second phases alternate in accordance with a clock signal.

9. The multiplexer of claim 6, wherein the first and second bootstrap circuits collectively maintain a gate to source voltage of the transistor at a constant value during the first and second phases.

10. The multiplexer of claim 9, wherein the constant value is the supply voltage value.

11. A method, comprising:

selecting a switch circuit from a plurality of switch circuits of a multiplexer including a plurality of input terminals and an output terminal, each switch circuit coupled between a respective input terminal and the output terminal, each switch circuit including, a main transistor coupled between the input terminal and the output terminal of the multiplexer, a first bootstrap circuit, and a second bootstrap circuit;

passing a signal from the input terminal coupled to the selected switch circuit through the main transistor of the selected switch circuit to the output terminal of the multiplexer;

coupling the first bootstrap circuit of the selected switch circuit between a gate terminal and a source terminal of the main transistor of the selected switch circuit during a first phase; and coupling the second bootstrap circuit between the gate terminal and the source terminal of the main transistor of the selected switch circuit during a second phase alternating with the first phase.

12. The method of claim 11, further comprising:

decoupling the first bootstrap capacitor from the gate and source terminals of the selected switch circuit during the second phase; and decoupling the second bootstrap capacitor from the gate and source terminals of the selected switch circuit during the first phase.

13. The method of claim 12, further comprising:

charging the first capacitor of the selected switch circuit to a supply voltage value during the second phase; and charging the second capacitor of the selected switch circuit to the supply voltage value during the first phase.

14. The method of claim 13, further comprising maintaining a gate to source voltage of the main transistor of the selected switch circuit at the supply voltage value during the first and second phases.

15. The method of claim 14, further comprising alternating between the first and second phases based on a clock signal.

16. The method of claim 15, wherein coupling and decoupling the first bootstrap capacitor of the selected switch circuit includes controlling a plurality of first switches of the selected switch circuit based on the clock signal.

17. The method of claim 16, wherein coupling and decoupling the second bootstrap capacitor of the selected switch circuit includes controlling a plurality of second switches of the selected switch circuit based on the clock signal.

18. An integrated circuit, comprising:
a multiplexer, including:
a plurality of inputs;
an output;
a plurality of switch circuits coupled between an output terminal and a respective input terminal, each switch circuit including:
a main transistor having a source terminal coupled to the input, a drain terminal coupled to the output, and a gate terminal;
a first bootstrap circuit having a first capacitor configured to be selectively coupled to and decoupled from the input; and
a second bootstrap circuit having a second capacitor configured to be selectively coupled to and decoupled from the input.

19. The integrated circuit of claim 18, further comprising an analog-to-digital converter configured to receive a signal from the output and to convert the signal to a digital signal.

20. The integrated circuit of claim 18, wherein the first boot strap circuit receives a first clock signal, a second clock signal, and a first phase signal 180 degrees out of phase with the first clock signal, wherein the second boot strap circuit receives the first clock signal, the second clock signal, and a second phase signal 180 degrees out of phase with the second clock signal.

* * * * *